United States Patent
Hayashi

(10) Patent No.: US 9,261,776 B2
(45) Date of Patent: Feb. 16, 2016

(54) IMPRINT APPARATUS, AND METHOD OF MANUFACTURING ARTICLE

(75) Inventor: Nozomu Hayashi, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 545 days.

(21) Appl. No.: 13/600,476

(22) Filed: Aug. 31, 2012

(65) Prior Publication Data
US 2013/0056903 A1    Mar. 7, 2013

(30) Foreign Application Priority Data

Sep. 1, 2011 (JP) .................. 2011-191067

(51) Int. Cl.
| | |
|---|---|
| *B29C 59/02* | (2006.01) |
| *G03F 7/00* | (2006.01) |
| *B82Y 10/00* | (2011.01) |
| *B82Y 40/00* | (2011.01) |

(52) U.S. Cl.
CPC ............... *G03F 7/0002* (2013.01); *B82Y 10/00* (2013.01); *B82Y 40/00* (2013.01)

(58) Field of Classification Search
CPC ...... B29C 59/02; B29C 59/022; G03F 7/0002
See application file for complete search history.

(56) References Cited

U.S. PATENT DOCUMENTS

| | | | |
|---|---|---|---|
| 7,807,065 B2 | 10/2010 | Tokita et al. | |
| 8,178,366 B2 | 5/2012 | Miyoshi et al. | |
| 2011/0074064 A1 | 3/2011 | Hayashi | |

FOREIGN PATENT DOCUMENTS

| | | |
|---|---|---|
| JP | 2007-165400 A | 6/2007 |
| JP | 2011097025 A | 5/2011 |
| JP | 2011258605 A | 12/2011 |

OTHER PUBLICATIONS

Office Action issued in JP2011-191067, mailed Jul. 13, 2015. English translation provided.
Office Action issued in JP2011-191067, mailed Jul. 13, 2015.

*Primary Examiner* — James Sanders
(74) *Attorney, Agent, or Firm* — Rossi, Kimms & McDowell LLP

(57) ABSTRACT

The present invention provides an imprint apparatus which performs an imprint process in which an imprint material on a substrate is molded with a mold to form a pattern on the substrate, the apparatus including a controller configured to control the imprint process to form a predetermined layer on the substrate with a target layer, which is formed on the substrate, used as an alignment reference, wherein the controller is configured to select a mold from a plurality of molds prepared for the predetermined layer, such that an overlay error between the target layer and the predetermined layer falls within a tolerance.

10 Claims, 6 Drawing Sheets

FIG. 2A

|  | SHIFT X | SHIFT Y | MAGNIFI-CATION X | MAGNIFI-CATION Y | ROTA-TION X | ROTA-TION Y | P01X | P01Y | P02X | P02Y | ... | P09X | P09Y |
|---|---|---|---|---|---|---|---|---|---|---|---|---|---|
| MOLD 01 | sx01 | sy01 | mx01 | my01 | tx01 | ty02 | p01x01 | p01y01 | p02x01 | p02y01 | ... | p09x01 | p09y01 |
| MOLD 02 | sx02 | sy02 | mx02 | my02 | tx02 | ty03 | p01x02 | p01y02 | p02x02 | p02y02 | ... | p09x02 | p09y02 |
| MOLD 03 | sx03 | sy03 | mx03 | my03 | tx03 | ty04 | p01x03 | p01y03 | p02x03 | p02y03 | ... | p09x03 | p09y03 |
| MOLD 04 | sx04 | sy04 | mx04 | my04 | tx04 | ty05 | p01x04 | p01y04 | p02x04 | p02y04 | ... | p09x04 | p09y04 |
| MOLD 05 | sx05 | sy05 | mx05 | my05 | tx05 | ty06 | p01x05 | p01y05 | p02x05 | p02y05 | ... | p09x05 | p09y05 |
| MOLD 06 | sx06 | sy06 | mx06 | my06 | tx06 | ty07 | p01x06 | p01y06 | p02x06 | p02y06 | ... | p09x06 | p09y06 |
| MOLD 07 | sx07 | sy07 | mx07 | my07 | tx07 | ty08 | p01x07 | p01y07 | p02x07 | p02y07 | ... | p09x07 | p09y07 |
| MOLD 08 | sx08 | sy08 | mx08 | my08 | tx08 | ty09 | p01x08 | p01y08 | p02x08 | p02y08 | ... | p09x08 | p09y08 |
| MOLD 09 | sx09 | sy09 | mx09 | my09 | tx09 | ty10 | p01x09 | p01y09 | p02x09 | p02y09 | ... | p09x09 | p09y09 |
| ... | ... | ... | ... | ... | ... | ... | ... | ... | ... | ... | ... | ... | ... |
| MOLD 00 | sx00 | sy00 | mx00 | my00 | tx00 | ty10 | p01x00 | p01y00 | p02x00 | p02y00 | ... | p09x00 | p09y00 |

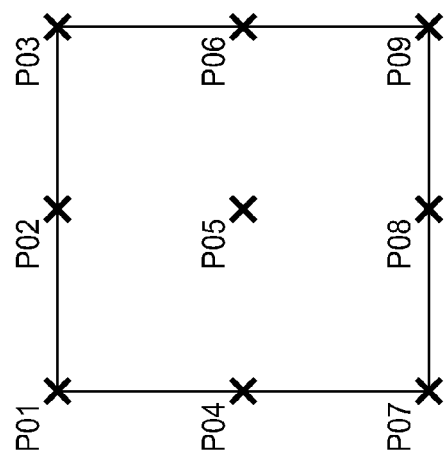

FIG. 2B

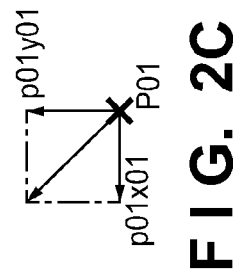

FIG. 2C

FIG. 4
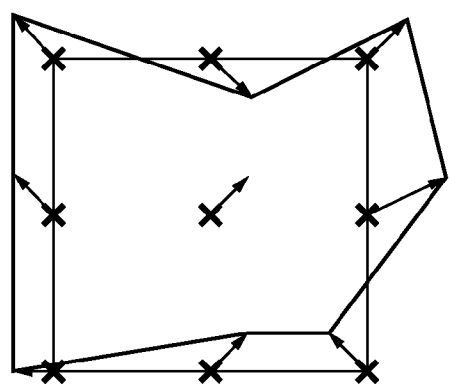
MOLD M01
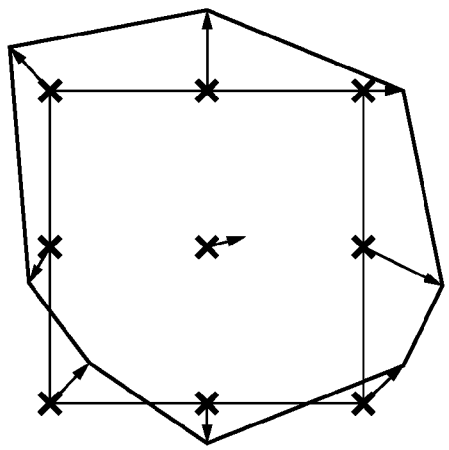
MOLD M02
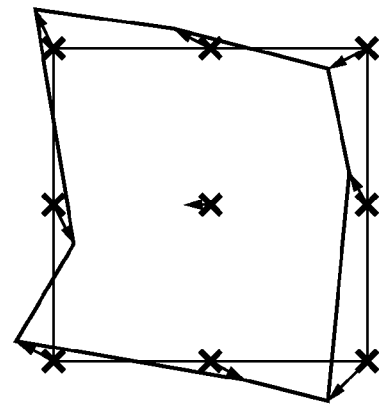
MOLD M03
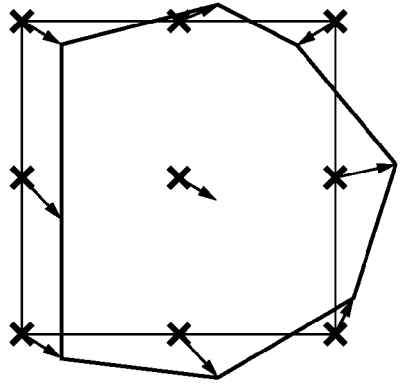
MOLD M04
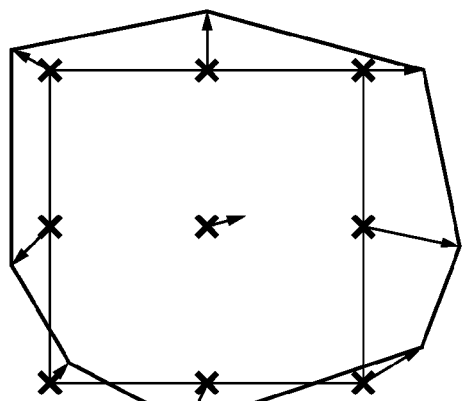
MOLD M00

IMPRINT APPARATUS, AND METHOD OF MANUFACTURING ARTICLE

BACKGROUND OF THE INVENTION

1. Field of the Invention

The present invention relates to an imprint apparatus, and a method of manufacturing an article.

2. Description of the Related Art

An exposure apparatus which projects (transfers) the pattern of a reticle onto a resist (photosensitive material) on a substrate is employed as a lithography apparatus for manufacturing a device such as a semiconductor device. By developing the resist, a resist pattern is formed on the substrate, and used as a mask to etch an underlying layer and implant ions into the substrate.

Japanese Patent Laid-Open No. 2007-165400 proposes an imprint apparatus as another lithography apparatus for manufacturing a device such as a semiconductor device. The imprint apparatus shapes and cures an imprint material on a substrate using a mold to form a pattern corresponding to a resist pattern on the substrate.

However, although an imprint apparatus typically applies a force or heat to a mold in accordance with the shape of each shot region on the substrate to correct the shape of the mold, it can correct only simple components such as magnification, trapezoidal, and skew components in that case. This means that the imprint apparatus cannot correct other components, and may be disadvantageous in minimizing an overlay error. The overlay error means herein a shift between a pattern already formed on the substrate, and a pattern newly formed on the former pattern by the imprint apparatus.

SUMMARY OF THE INVENTION

The present invention provides, for example, an imprint apparatus advantageous in reduction of an overlay error.

According to one aspect of the present invention, there is provided an imprint apparatus which performs an imprint process in which an imprint material on a substrate is molded with a mold to form a pattern on the substrate, the apparatus including a controller configured to control the imprint process to form a predetermined layer on the substrate with a target layer, which is formed on the substrate, used as an alignment reference, wherein the controller is configured to select a mold from a plurality of molds prepared for the predetermined layer, such that an overlay error between the target layer and the predetermined layer falls within a tolerance.

Further features of the present invention will become apparent from the following description of exemplary embodiments with reference to the attached drawings.

BRIEF DESCRIPTION OF THE DRAWINGS

FIGS. 2A to 2C are views for explaining an example of pattern shape information indicating the shape of the pattern of each of a plurality of molds.

FIG. 4 shows views of an example of the shapes of different types of molds.

DESCRIPTION OF THE EMBODIMENTS

Figure 1:
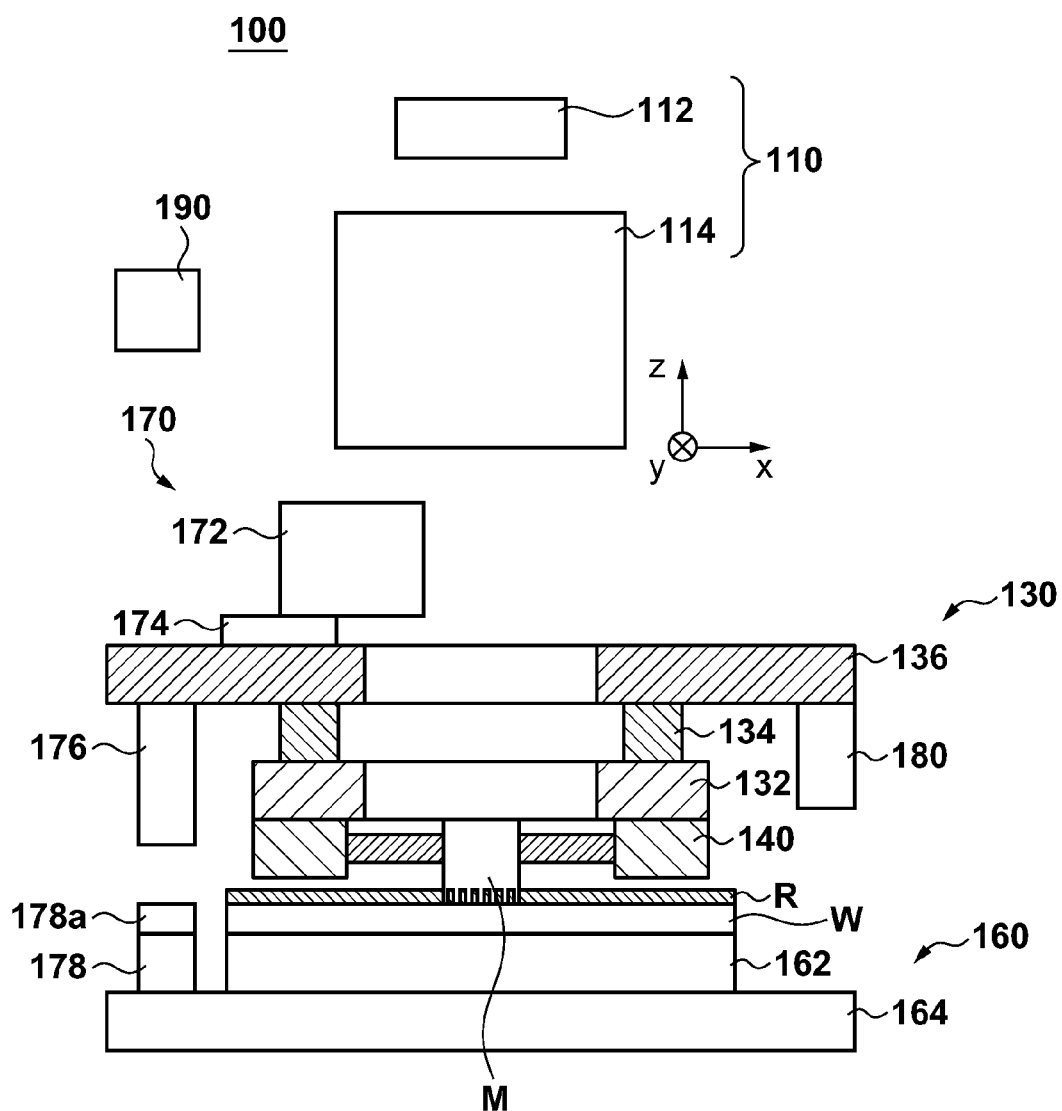
FIG. 1 is a view showing the configuration of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a view showing the configuration of an imprint apparatus 100 according to an aspect of the present invention. The imprint apparatus 100 performs an imprint process of shaping an imprint material on a substrate using a mold to form a pattern on the substrate. In this embodiment, the imprint apparatus 100 adopts the photo-curing method of curing an imprint material by irradiation with ultraviolet rays, as a method of curing an imprint material. However, the imprint apparatus 100 can also adopt a curing method (heat curing method) of curing an imprint material by applying energy (for example, heat) other than light to it, or can cure an imprint material by irradiation with light other than ultraviolet rays.

In this embodiment, the imprint apparatus 100 repeats an imprint process to form a pattern in each of a plurality of shot regions on a substrate. In the imprint process, an imprint material supplied onto one shot region on the substrate is cured while a mold is kept in contact with the imprint material, and the mold is released from (peeled off) the cured imprint material, thereby forming a pattern in this shot region on the substrate.

The imprint apparatus 100 includes a curing unit 110, mold holding mechanism 130, mold deforming unit 140, substrate holding mechanism 160, alignment measurement elements 170, resin supply unit 180, and control unit 190, as shown in FIG. 1. The imprint apparatus 100 also includes, for example, a base and antivibration device (damper) (neither is shown). The base supports the entire imprint apparatus 100, and forms a reference plane in moving a substrate stage 164. The antivibration device damps vibration from a floor and supports the base.

The curing unit 110 includes a light source unit 112 and optical system 114, and irradiates an ultraviolet-curing resin (imprint material) R on a substrate W with ultraviolet rays via a mold M to cure the resin R. The light source unit 112 includes, for example, a light source such as a halogen lamp which emits ultraviolet rays (for example, the i- or g-line), and an elliptical mirror which focuses ultraviolet rays from the light source. The optical system 114 includes, for example, a lens and aperture for irradiating the resin R supplied onto one shot region on the substrate W with ultraviolet rays from the light source unit 112. The optical system 114 may also include an optical integrator to uniformly irradiate the resin R with ultraviolet rays via the mold M. The aperture is used in view angle control to irradiate only the target shot region (the resin R supplied onto it) with ultraviolet rays, and ambient light shielding control to prevent the ultraviolet rays from striking a region that falls outside the outer shape of the substrate W.

The mold M is a mold (original) on which a pattern (microstructural pattern) to be transferred onto the substrate W is formed. The mold M is formed by a material transparent in the wavelength range of ultraviolet rays, such as quartz, so as to transmit ultraviolet rays from the curing unit 110. The mold M is conveyed by a mold conveyance mechanism implemented by, for example, a conveyance robot including a chuck (for example, a vacuum chuck).

Upon repetitions of an imprint process, the pattern of the mold M wears out and dust collects on the pattern of the mold M, so it is impossible to permanently use one mold M. Hence, in the imprint apparatus 100, a plurality of molds (replica molds) M having patterns with the same shape are stocked (prepared) and used upon replacement. However, the replica molds inevitably have patterns with slightly different shapes (linear components of, for example, a shift, a magnification, and a rotation, high-order components, and random components) due, for example, to manufacturing errors. In this embodiment, the shape of the pattern of each of the plurality of molds M stocked in the imprint apparatus 100 is measured by an external measurement apparatus, and information (pattern shape information) indicating the shape of the pattern of each of the plurality of molds M is stored in a storage unit. The storage unit which stores the pattern shape information may be, for example, a memory of the control unit 190, or an external memory.

FIGS. 2A to 2C are views for explaining the pattern shape information of each of a plurality of molds M00 to M09. FIG. 2A illustrates an example of the pattern shape information. The pattern shape information includes, for example, a shift (shifts X and Y), a magnification (magnifications X and Y), a rotation (rotations X and Y), and high-order components and random components (P01X, P01Y), . . . , (P09X, P09Y) at nine positions P01 to P09, respectively, in each mold. Note that FIG. 2B illustrates an example of the nine positions P01 to P09 in each mold, and FIG. 2C shows how to define high-order components and random components at the positions P01 to P09. Also, the mold M00 is used in an imprint process for forming an underlying layer (for example, a target layer).

The mold holding mechanism 130 includes, for example, a mold chuck 132 which holds the mold M, a driving unit 134 which drives the mold chuck 132 (that is, the mold M), and a mold base 136 which supports the driving unit 134. The mold holding mechanism 130 implements a function of controlling the position of the mold M about six axes (positioning the mold M), and a function of pressing the mold M against the resin R on the substrate W or peeling the mold M off the cured resin R. The six axes mean herein X-, Y-, and Z-axes defined in an X-Y-Z coordinate system having the holding surface of the mold chuck 132 (a surface which holds the mold M) as its X-Y plane, and an axis along a direction perpendicular to the X-Y plane as its Z-axis, and axes along the directions of rotations about the X-, Y-, and Z-axes.

The mold deforming unit 140 is placed on the mold chuck 132, and includes, for example, a deforming mechanism which deforms (corrects) the shape of the pattern of the mold M by applying a force to the side surface of the mold M using a cylinder actuated by, for example, air or oil. Alternatively, the mold deforming unit 140 may include a deforming mechanism which deforms the shape of the pattern of the mold M by controlling the temperature of the mold M. Since the substrate W may deform (typically, expand or contract) upon a process such as a heat treatment, the mold deforming unit 140 deforms the shape of the pattern of the mold M so that the overlay error satisfies an allowable value, in accordance with deformation of the substrate W.

The substrate holding mechanism 160 includes, for example, a substrate chuck 162 which holds the substrate W, and the substrate stage 164 which drives the substrate chuck 162 (that is, the substrate W). The substrate holding mechanism 160 implements a function of controlling the position of the substrate W about six axes (positioning the substrate W).

In this embodiment, the alignment measurement elements 170 includes an alignment scope 172, an alignment stage 174, an off-axis scope (OAS) 176, and a reference mark table 178 having a reference mark 178a formed on it. The alignment scope 172 includes an AAS (Automatic Adjustment Scope) which aligns the mold M and each shot region on the substrate W with each other. The alignment scope 172 detects the position of alignment marks formed on the mold M, and that of the reference mark 178a through the mold M. The alignment stage 174 is placed on the mold base 136 and positions the alignment scope 172. A baseline length is obtained by detecting the position of the reference mark 178a using the off-axis scope 176, thereby detecting the position of alignment marks on the substrate W with reference to the reference mark 178a based on the baseline length. The reference mark 178a is used to measure the positional relationships among the off-axis scope 176, the substrate stage 164, and the mold M.

The resin supply unit 180 supplies (dispenses) the resin R onto the substrate W and, more specifically, the shot region in which the pattern of the mold M is to be transferred. The resin supply unit 180 includes, for example, a tank which stores the resin R, a nozzle which discharges onto the substrate W the resin R supplied from the tank via a supply path, a valve placed in the supply path, and a supply rate control unit. In one resin discharge operation, the supply rate control unit controls the valve to supply a predetermined amount of resin onto one shot region to, in turn, control the rate at which the resin R is supplied onto the substrate W.

The control unit 190 includes, for example, a CPU and memory and controls the overall imprint apparatus 100 (each unit of the imprint apparatus 100). The control unit 190 executes an overlay measurement process in cooperation with the off-axis scope 176 in the interval between imprint processes. In the overlay measurement process, the marks formed on the substrate W are detected using the off-axis scope 176 to obtain an overlay error based on the detection result. The overlay error is a shift between a pattern already formed on the substrate W, and a pattern newly formed on the substrate W. In this embodiment, the overlay error is especially assumed to be a shift between a target layer serving as a reference for alignment of a layer formed on the substrate W, and a layer (predetermined layer) formed on the target layer. Note that the predetermined layer includes a layer formed on the target layer, and a layer formed on an interlayer, as will be described later. Also, the control unit 190 functions as a selection unit which selects one mold from the plurality of molds M, and a processing unit which performs an imprint process using the selected mold, as will be described later.

Figure 3:
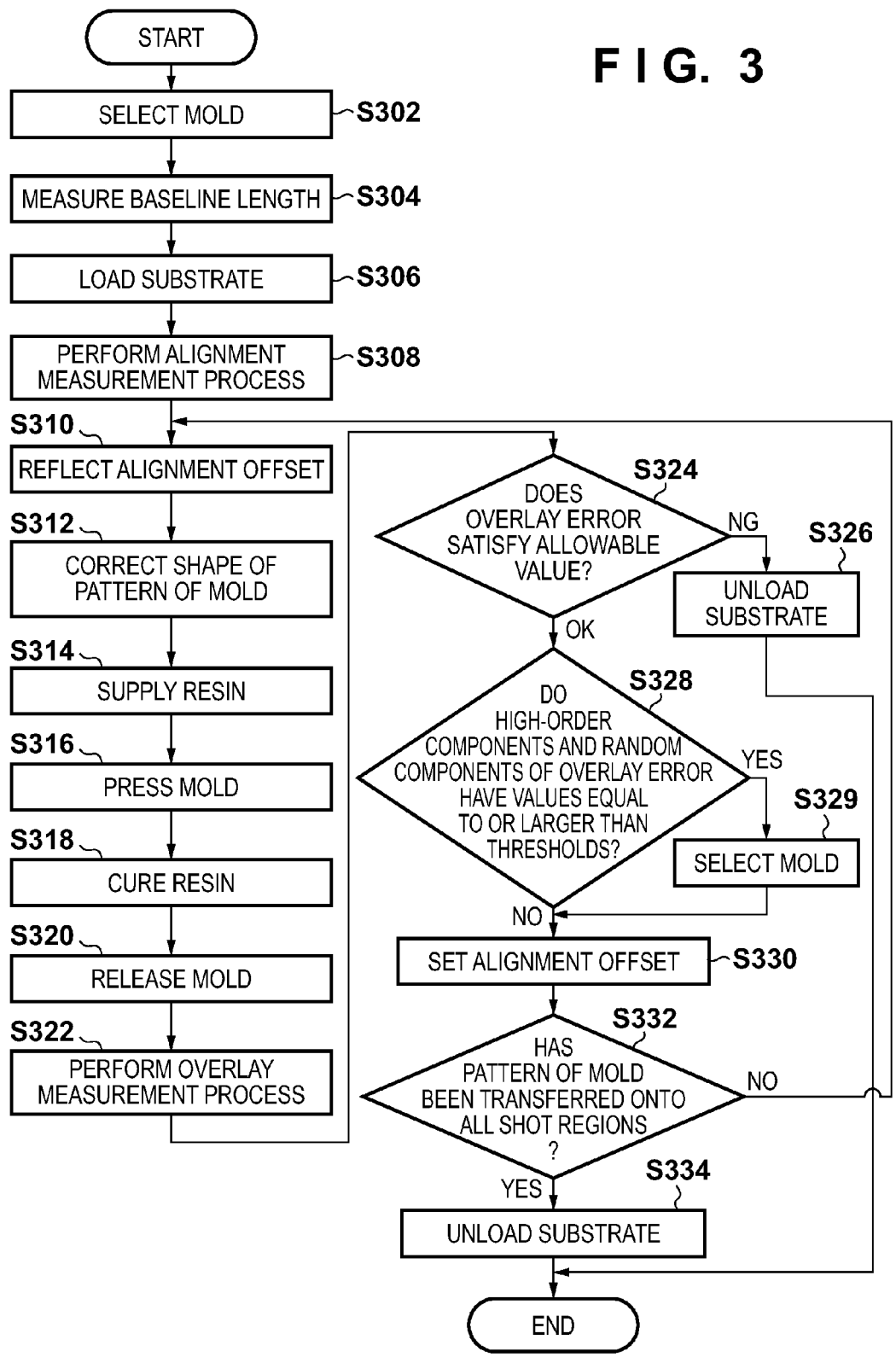
FIG. 3 is a flowchart for explaining the operation (imprint process) of the imprint apparatus shown in FIG. 1.

The operation of the imprint apparatus 100 (imprint process) will be described with reference to FIG. 3. The control unit 190 systematically controls each unit of the imprint apparatus 100, thereby performing the imprint process, as described above.

In step S302, a mold M having a pattern for forming a layer on an underlying layer (target layer) is selected. Note that the selected mold M is conveyed by the mold conveyance mechanism and held by the mold holding mechanism 130 (mold chuck 132).

In this embodiment, the plurality of molds M01 to M09 are prepared as replica molds in the imprint apparatus 100, as described above. Hence, a mold having an overlay error which satisfies an allowable value (that is, falls within a tolerance) is selected from the plurality of molds M01 to M09 based on the shape of a mold M00 (its pattern) used in an imprint process in which an underlying layer is formed. A mold having a shape closest to that of a mold used in an imprint process in which an underlying layer is formed (that is, having a shape difference which falls within a tolerance), for example, can be selected. More specifically, a mold Mi (i=01 to 09) is selected so as to minimize a sum of squares Ei of shape differences (PnXi−PnX00) and (PnYi−PnY00) between the molds M00 and Mi at each position Pn (n=01 to 09), which is given by:

$$Ei = \Sigma_{n=01-09}(PnXi-PnX00)^2 + (PnYi-PnY00)^2 \quad (1)$$

When the molds M00 and M01 to M04 have shapes as shown in, for example, FIG. 4, the mold M02 having a shape closest to that of the mold M00 is selected by referring to the pattern shape information stored in the storage unit.

In step S304, a baseline length is measured. More specifically, first, the positional relationship between the reference mark 178a formed on the reference mark table 178 and the alignment marks formed on the mold M is detected using the alignment scope 172 through the mold M. The substrate stage 164 is driven so as to position the reference mark 178a below the off-axis scope 176, thereby detecting the position of the reference mark 178a using the off-axis scope 176. A baseline length is obtained based on the detection results obtained by the alignment scope 172 and off-axis scope 176.

Figure 5:
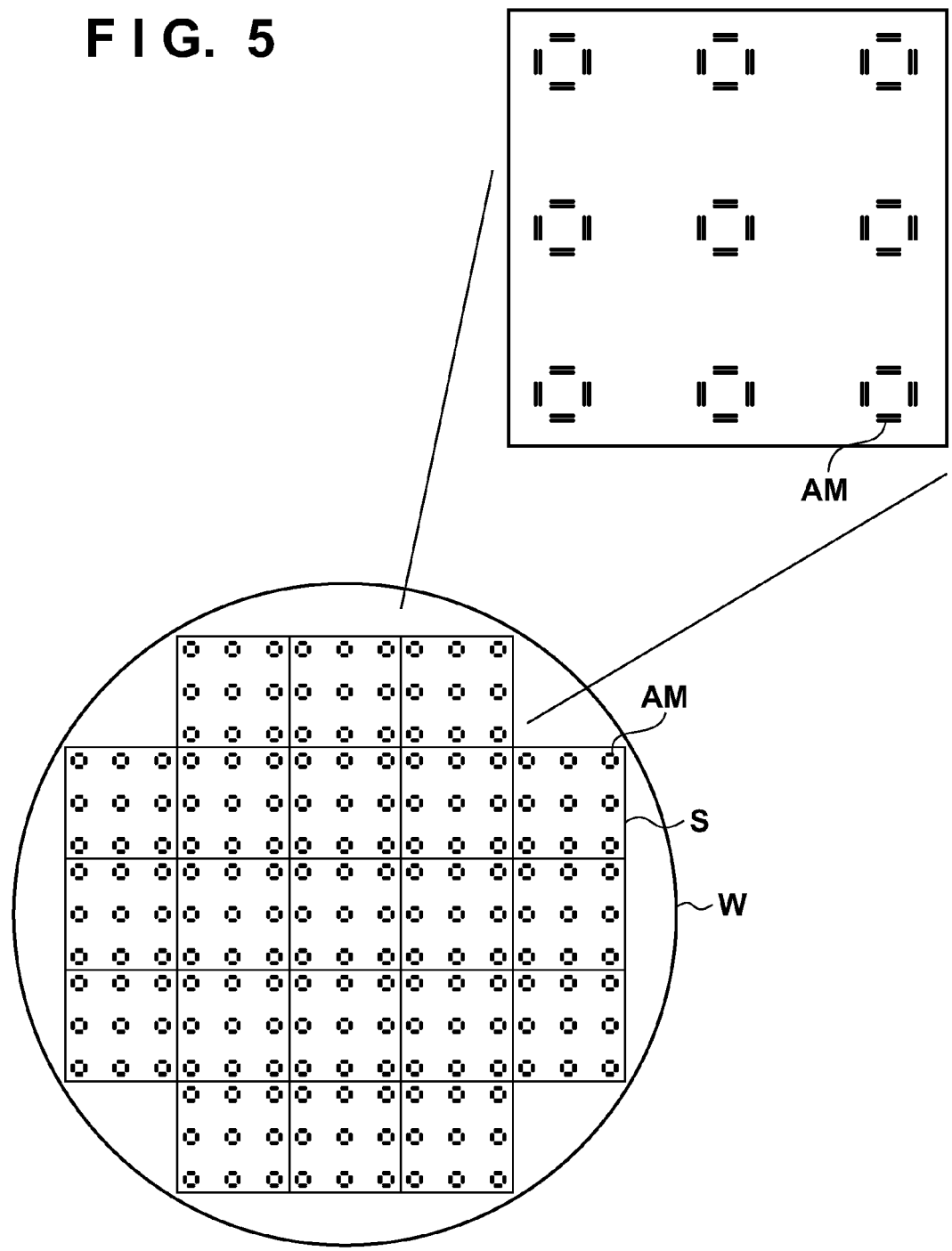
FIG. 5 shows views of an example of alignment marks formed on a substrate.
Figure 6A:
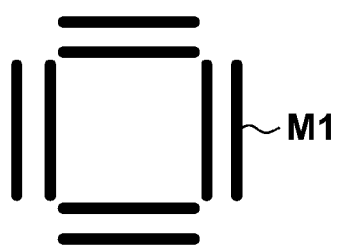
FIGS. 6A to 6C are views for explaining marks formed in each layer on the substrate to detect an overlay error.
Figure 6B:
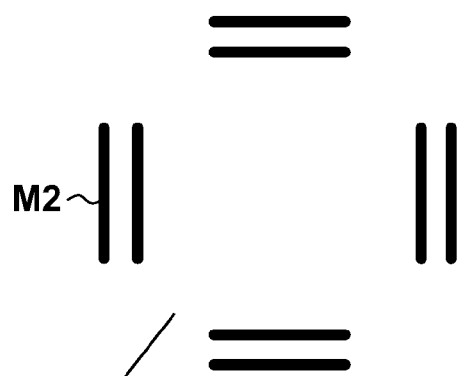
Figure 6C:
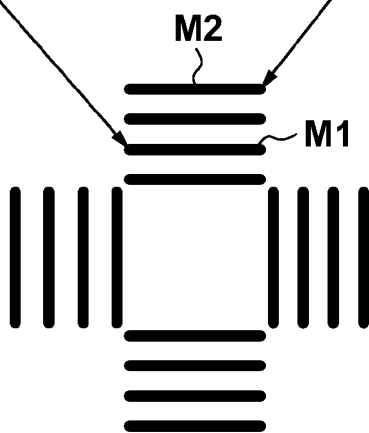

In step S306, a substrate W is loaded through a substrate conveyance mechanism (not shown) and held on the substrate holding mechanism 160 (substrate chuck 162). In this case, at least one layer (target layer) is formed on the substrate W, together with alignment marks. FIG. 5 shows views of an example of alignment marks AM formed on the substrate W. The alignment marks AM are formed in each of a plurality of shot regions S on the substrate W, as shown in FIG. 5. Also, marks for detecting an overlay error are formed in each layer on the substrate W, as shown in FIGS. 6A to 6C. FIG. 6A shows a mark M1 formed in a first layer on the substrate W, and FIG. 6B shows a mark M2 in a second layer beneath the first layer. FIG. 6C shows the superposed state of the marks M1 and M2, and an overlay error can be detected in this state.

In step S308, an alignment measurement process is performed in accordance with the global alignment scheme. More specifically, the position of the alignment marks AM formed in a sample shot region on the substrate W is detected using the off-axis scope 176 to determine the information of placement (for example, the coordinate position, rotation, and magnification) of each shot region S on the substrate W based on the detection result.

In step S310, a preset alignment offset is reflected on the information of placement (for example, the coordinate position, rotation, and magnification) of the target shot region to undergo an imprint process. The reflection means herein correction of the information of placement of the target shot region.

In step S312, the shape of the pattern of the mold M selected in step S302 is corrected. More specifically, the mold deforming unit 140 deforms the shape of the pattern of the mold M (that is, corrects its magnification) in accordance with the pattern formed in the layers on the substrate W. However, correction of the shape of the pattern of the mold M can also be omitted.

In step S314, the resin supply unit 180 supplies (dispenses) a resin R onto the target shot region on the substrate W. More specifically, the substrate stage 164 is driven so as to position the target shot region below the resin supply unit 180, and is scanned while a resin R is supplied from the resin supply unit 180 onto the target shot region, thereby dispensing the resin R onto the target shot region.

In step S316, the mold M is pressed against the resin R supplied onto the target shot region on the substrate W (the mold M comes into contact with the resin R). More specifically, the substrate stage 164 is driven so as to position the target shot region at a position at which it faces the pattern of the mold M (that is, a position at which the mold M comes into contact with the resin R). The mold M is lowered by the mold holding mechanism 130 and thereby pressed against the resin R on the target shot region. Note that the pressing force of the mold M against the resin R is controlled using a sensor built into the driving unit 134. In this embodiment, the mold M is pressed against the resin R on the target shot region by driving it while the substrate W is fixed in position. However, the mold M may be pressed against the resin R on the target shot region by driving the substrate W while it is fixed in position.

In step S318, the resin R is cured while the mold M is kept pressed against the resin R on the target shot region. More specifically, the curing unit 110 irradiates the resin R with ultraviolet rays via the mold M while the mold M is kept pressed against the resin R on the target shot region. Upon this operation, the resin R on the target shot region cures, so the pattern of the mold M is transferred onto it.

In step S320, the mold M is released from (peeled off) the resin R cured upon irradiation with ultraviolet rays. More specifically, the mold holding mechanism 130 lifts and releases the mold M from the cured resin R. In this embodiment, the mold M is released from the cured resin R by driving it while the substrate W is fixed in position. However, the mold M may be released from the cured resin R by driving the substrate W while it is fixed in position.

In step S322, an overlay measurement process is performed. More specifically, the substrate stage 164 is driven so as to position the marks (see FIG. 6C) for detecting an overlay error below the off-axis scope 176, thereby detecting these marks using the off-axis scope 176. An overlay error is obtained based on the detection result obtained by the off-axis scope 176. In other words, in step S322, the difference (that is, an overlay error) between the shape of a shot region in the target layer and that of a shot region in a layer (interlayer) formed on the target layer is detected. The interlayer means herein a layer formed between the target layer and a layer to be formed next and, for example, a layer formed immediately before another layer is formed next.

In step S324, it is determined whether the overlay error obtained in step S322 satisfies an allowable value. If NG is determined in step S324, the process advances to step S326, in which the substrate W is unloaded through the substrate conveyance mechanism. Note that the substrate W unloaded in this case (that is, a substrate having an overlay error which does not satisfy the allowable value) is reworked. However, if OK is determined in step S324, the process advances to step S328.

In step S328, it is determined whether the high-order components and random components of the overlay error obtained in step S322 have values equal to or larger than thresholds. Even when the overlay error satisfies the allowable value, if the high-order components and random components of the overlay error have values equal to or larger than the thresholds, they cannot be corrected by deforming the pattern of the mold M by the mold deforming unit 140. Therefore, if YES is determined in step S328, the process advances to step S329. However, if NO is determined in step S328, the process advances to step S330.

In step S329, a mold having an overlay error which satisfies the allowable value is selected from the plurality of molds M01 to M09 based on the overlay error obtained in step S322. More specifically, a mold is selected based on a shape obtained by adding as an offset dimensions determined in accordance with the overlay error obtained in step S322 to the shape of the pattern of the current mold M (that is, the mold M02 used in steps S316 to S320 in this embodiment).

The case wherein, for example, the overlay errors at the nine positions P01 to P09 in the mold are defined as E01X to E09X and E01Y to E09Y, and the mold M02 is selected as the current mold M will be considered. In this case, shapes P01X' to P09X' and P01Y' to P09Y' at the nine positions P01 to P09, respectively, in an ideal mold are given by:

$$P01X' = P01X02 + E01X$$
$$P02X' = P02X02 + E0$$
$$\vdots$$
$$P09X' = P09X02 + E09X$$
$$P01Y' = P01Y02 + E01Y$$
$$P02Y' = P02Y02 + E02Y$$
$$\vdots$$
$$P09Y' = P09Y02 + E09Y$$

Hence, a mold Mi (i=01 to 09) is selected so as to minimize a sum of squares Ei of shape differences (PnXi−PnX') and (PnYi−PnY') between the ideal mold and each of the plurality of molds Mi at each position Pn (n=01 to 09), which is given by:

$$Ei = \Sigma_{n=01-09}(PnXi-PnX00)^2 + (PnYi-PnY00)^2 \quad (2)$$

Also, in step S329, a shape obtained by deforming the shape of the pattern of each of the plurality of molds M01 to M09 by the mold deforming unit 140 may be taken into consideration. More specifically, a mold may be selected based on the difference between the shape of the pattern deformed by the mold deforming unit 140, and that obtained by adding as an offset dimensions determined in accordance with the overlay error to the shape of the pattern of the current mold.

In step S330, linear components, other than high-order components and random components, of the overlay error obtained in step S322 are set as an alignment offset. In other words, the value of the alignment offset is updated based on the result of an overlay measurement process.

In step S332, it is determined whether the pattern of the mold M has been transferred onto all shot regions on the substrate W. If NO is determined in step S332, the process returns to step S310, in which a process for transferring the pattern of the mold M onto the next target shot region (that is, the above-mentioned process) is performed. However, if YES is determined in step S332, the process advances to step S334, in which the substrate W is unloaded through the substrate conveyance mechanism.

In this manner, in this embodiment, a mold having an overlay error between a target layer and a layer to be formed next, which satisfies an allowable value, is selected in accordance with a mold (its pattern shape) used in an imprint process for forming the target layer. In addition, an overlay measurement process is performed in the interval between imprint processes to quickly detect an overlay error, thereby selecting a mold having an overlay error between a target layer and a layer to be formed next, which satisfies an allowable value, based on the detection result. Hence, the imprint apparatus 100 can reduce an overlay error, compared to the conventional imprint apparatus which uses no criterion for selecting a mold used in an imprint process (that is, an imprint apparatus which does not take an overlay error into consideration). Especially in an imprint apparatus, the overlay error fluctuates for every imprint process due to deformation, damage, and deterioration of a mold upon pressing of the mold against a resin on a substrate, so the imprint apparatus 100 in this embodiment is very useful.

In this embodiment, in step S302, a mold having an overlay error which satisfies an allowable value is selected based on the shape of the pattern of a mold used in an imprint process for forming a target layer. However, a mold having an overlay error which satisfies an allowable value may be selected based on the shape of a shot region in the target layer. More specifically, the shape of a shot region in the target layer may be obtained based on the result of an alignment measurement process (the detection result obtained by the off-axis scope 176) in step S308, thereby selecting a mold based on the shape of this shot region. In this case, the control unit 190 can function as, for example, an obtaining unit which obtains the shape of a shot region in the target layer.

Also, in this embodiment, in step S308, an alignment measurement process is performed in accordance with the global alignment scheme. However, the mold and each shot region on the substrate may be aligned with each other (that is, the dye-by-dye alignment scheme may be adopted) in pressing the mold against the resin on the substrate (step S316).

Moreover, in this embodiment, resin supply (step S314), mold pressing (step S316), resin curing (step S318), and mold releasing (step S320) are performed for each shot region on the substrate. However, mold pressing, resin curing, and mold releasing may be performed for each of a plurality of shot regions on the substrate after a resin is supplied onto the plurality of shot regions at once.

Again, although the off-axis scope 176 is used as a detection unit which detects an overlay error in this embodiment, the alignment scope 172 or other detectors may be used to detect an overlay error.

<Embodiment of Method of Manufacturing Article>

A method of manufacturing a device (for example, a semiconductor integrated circuit device or a liquid crystal display device) as an article includes a step of forming a pattern on a substrate (a wafer, a glass plate, or a film-like substrate) using the above-mentioned imprint apparatus. This method also includes a step of etching the substrate having the pattern formed on it. Note that when other articles such as a patterned medium (recording medium) or an optical element are to be manufactured, this method includes other processes of processing the substrate having the pattern formed on it, in place of etching. The method of manufacturing an article according to this embodiment is more advantageous in at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-191067 filed on Sep. 1, 2011, which is hereby incorporated by reference herein in its entirety.

What is claimed is:

1. An imprint apparatus for performing an imprint process in which an imprint material on a substrate is molded with a mold to form a pattern on the substrate, the imprint apparatus comprising:

a controller configured to:
control the imprint process to form a predetermined layer on the substrate with a target layer, which is formed on the substrate, used as an alignment reference;
obtain information of a difference between a shape of a shot region in the target layer, and a shape of a shot region in an upper layer formed above the target layer; and
select a mold from a plurality of molds prepared for the predetermined layer, based on the difference and a shape of a mold used for forming the upper layer, so that an overlay error between the target layer and the predetermined layer falls within a tolerance.

2. The apparatus according to claim 1, wherein the controller is configured to select the mold based on a shape of a mold used for forming the target layer, and shapes of the plurality of molds.

3. The apparatus according to claim 1, wherein the controller is configured to:
obtain information of a shape of a shot region in the target layer; and
select the mold based on the shape of the shot region, and shapes of the plurality of molds.

4. The apparatus according to claim 1, further comprising a deforming device configured to deform the mold.

5. The apparatus according to claim 1, wherein the predetermined layer is a layer to be formed on the target layer.

6. The apparatus according to claim 1, wherein the predetermined layer is a layer to be formed on the upper layer.

7. A method of manufacturing an article, the method comprising the steps of:
forming a pattern on a substrate using an imprint apparatus; and
processing the substrate on which the pattern has been formed,
wherein the imprint apparatus performs an imprint process in which an imprint material on the substrate is molded with a mold, and comprises:
a controller configured to:
control the imprint process to form a predetermined layer on the substrate with a target layer, which has been formed on the substrate, used as an alignment reference;
obtain information of a difference between a shape of a shot region in the target layer, and a shape of a shot region in an upper layer formed above the target layer; and
select a mold from a plurality of molds prepared for the predetermined layer, based on the difference and a shape of a mold used for forming the upper layer, so that an overlay error between the target layer and the predetermined layer falls within a tolerance.

8. An imprint apparatus for performing an imprint process in which an imprint material on a substrate is molded with a mold to form a pattern on the substrate, the imprint apparatus comprising:

a controller configured to:
control the imprint process to form a predetermined layer on the substrate with a target layer, which is formed on the substrate, used as an alignment reference; and
select a mold, to be used for the predetermined layer, from a plurality of molds prepared for the predetermined layer, based on a difference between a shape of each of the plurality of molds with respect to each of a plurality of positions therein and a shape of the mold used for forming the target layer or a shape of a pattern formed with the used mold in the target layer with respect to each of the plurality of positions therein, so that an overlay error between the target layer and the predetermined layer falls within a tolerance.

9. A method of manufacturing an article, the method comprising the steps of:
forming a pattern on a substrate using an imprint apparatus; and
processing the substrate on which the pattern has been formed,
wherein the imprint apparatus performs an imprint process in which an imprint material on the substrate is molded with a mold, and comprises:
a controller configured to:
control the imprint process to form a predetermined layer on the substrate with a target layer, which has been formed on the substrate, used as an alignment reference; and
select a mold, to be used for the predetermined layer, from a plurality of molds prepared for the predetermined layer, based on a difference between a shape of each of the plurality of molds with respect to each of a plurality of positions therein and a shape of the mold used for forming the target layer or a shape of a pattern formed with the used mold in the target layer with respect to each of the plurality of positions therein, so that an overlay error between the target layer and the predetermined layer falls within a tolerance.

10. An imprint method of performing an imprint process in which an imprint material on a substrate is molded with a mold to form a pattern on the substrate, the method comprising the steps of:
performing the imprint process to form a predetermined layer on the substrate with a target layer, which has been formed on the substrate, used as an alignment reference; and
selecting a mold, to be used for the predetermined layer, from a plurality of molds prepared for the predetermined layer, based on a difference between a shape of each of the plurality of molds with respect to each of a plurality of positions therein and a shape of the mold used for forming the target layer or a shape of a pattern formed with the used mold in the target layer with respect to each of the plurality of positions therein, so that an overlay error between the target layer and the predetermined layer falls within a tolerance.

* * * * *